United States Patent [19]

Inasaka

[11] Patent Number: 4,980,270

[45] Date of Patent: Dec. 25, 1990

[54] PRINTER CIRCUIT AND A PROCESS FOR PREPARING SAME

[75] Inventor: Jun Inasaka, Tokyo, Japan

[73] Assignee: NEC Corporation, Tokyo, Japan

[21] Appl. No.: 71,312

[22] Filed: Jul. 9, 1987

[30] Foreign Application Priority Data

Jul. 11, 1986 [JP] Japan .............................. 61-162068

[51] Int. Cl.⁵ .............................................. G03C 5/00
[52] U.S. Cl. .................................. 430/312; 430/313; 430/394
[58] Field of Search ............... 174/68.5; 430/312, 313, 430/315, 317, 394; 428/901; 156/616.3, 616.4, 616.41

[56] References Cited

U.S. PATENT DOCUMENTS

| | | |
|---|---|---|
| 3,634,602 | 1/1972 | von Brock . |
| 4,127,436 | 11/1978 | Friel ..................... 430/256 |
| 4,245,273 | 1/1981 | Feinberg et al. . |
| 4,347,306 | 8/1982 | Takeda et al. ............. 430/318 |
| 4,378,383 | 3/1983 | Moritz . |
| 4,434,224 | 2/1984 | Yoshikawa et al. ............ 430/312 |
| 4,451,326 | 5/1984 | Gwozdz . |
| 4,487,652 | 12/1984 | Almgren . |
| 4,495,220 | 1/1985 | Wolf et al. . |
| 4,504,540 | 3/1985 | Kaminaka et al. . |
| 4,521,476 | 6/1985 | Asai et al. . |
| 4,523,976 | 6/1985 | Bukhman . |
| 4,525,383 | 6/1985 | Saito . |
| 4,560,436 | 12/1985 | Bukhman et al. . |
| 4,572,764 | 2/1986 | Fan .............................. 430/313 |
| 4,578,304 | 3/1986 | Hamaguchi . |
| 4,591,547 | 5/1986 | Brownell ......................... 430/312 |
| 4,619,887 | 10/1986 | Hooper et al. .................. 430/315 |
| 4,630,355 | 12/1986 | Johnson . |
| 4,645,562 | 2/1987 | Liao et al. ....................... 430/312 |
| 4,672,152 | 6/1987 | Shinohara et al. . |
| 4,681,795 | 7/1987 | Tuckerman . |

FOREIGN PATENT DOCUMENTS 0176237  9/1985  Japan ................................. 430/312

OTHER PUBLICATIONS

J. P. Kent, Doublecoat Planar Polyimide Process, IBM Technical Disclosure Bulletin, vol. 27, No. 2, Jul. 1984, pp. 1149 and 1150.

Multilayer Interconnections Using Polyimide Dielectrics and Aluminum Conductors, Hedeki Tsunetsugu et al., IMC 1984 Proceedings, Tokyo, May 21–23, 1984, pp. 235–239.

Primary Examiner—Ellis P. Robinson
Assistant Examiner—Donald J. Loney
Attorney, Agent, or Firm—Burns, Doane, Swecker & Mathis

[57] ABSTRACT

A printed circuit comprising a substrate, a first conductive circuit pattern thereon and an insulator on the first conductive circuit pattern. The insulator has a via hole which extends down to and is tapered toward the first conductive circuit pattern. A second conductive circuit pattern is formed on the side wall of the via hole and on a portion of the first conductive circuit pattern. The tapered via hole allows the second conductive circuit pattern to ensure excellent electrical contact with the first conductive circuit pattern.

2 Claims, 3 Drawing Sheets

PRINTER CIRCUIT AND A PROCESS FOR PREPARING SAME

BACKGROUND OF THE INVENTION

The present invention relates to a printed circuit and a process for preparing it.

U.S. Pat. No. 4,572,764 discloses a multilayer printed circuit. This printed circuit comprises a first photosensitive insulator on a substrate. A first via hole is formed in the first insulator using a photoetching process. A second photosensitive insulator is formed on the first insulator having a second via hole aligned with the first via hole. The second via hole is larger in diameter than the first via hole, forming a combined via hole having a stepped portion between the first and second insulators. A conductive circuit pattern is deposited on the side walls of the aligned via holes. A layer of copper powder is adhered to the side walls of the combined via hole and the laminate is baked in an oven and cured. However, there is a likelihood of leaving a photoresistive material in the stepped portion to produce a potential cause of troubles in electroplating with a possible disconnection in the electroplated conductor.

SUMMARY OF THE INVENTION

It is therefore an object of the present invention to provide a printed circuit which is free from circuit pattern disconnections and eliminates the need for precision alignment of photomasks.

This object is attained by the formation of a downwardly tapered via hole in an insulator and by the deposition of a conductive circuit pattern on the side wall of the via hole into excellent electrical contact with an underlying conductive circuit pattern.

According to a first aspect of the present invention, there is provided a printed circuit comprising a substrate, a first conductive circuit pattern on the substrate, and an insulator on the first conductive circuit pattern. The insulator has a via hole which extends down to and is tapered toward the first conductive circuit pattern. A second conductive circuit pattern is formed on the side wall of the via hole and on a portion of the first conductive circuit pattern.

According to a second aspect of the present invention, there is provided a multilayer printed circuit having stacked first and second laminates. The first laminate is composed of a first conductive circuit pattern formed on a common substrate and an insulator on the first conductive circuit pattern. The insulator has a via hole extending to the first conductive circuit pattern and is tapered in a direction torward the first conductive circuit pattern. A second conductive circuit pattern is formed on the side wall of the via hole and on a portion of the first conductive circuit pattern. The second laminate is constructed in a manner similar to the first laminate with the exception that the first conductive circuit pattern thereof is formed on the second conductive circuit pattern of the first laminate. The first conductive circuit pattern of the first laminate and the second conductive circuit pattern of the second laminate are connected to an external circuit.

Preferably, the insulator is prepared by forming a first insulative layer on the first conductive circuit pattern. A via hole is then formed in the first insulative layer to expose a portion of the first conductive circuit pattern. A second insulative layer is formed on the first insulative layer such that the via hole of the first insulative layer is filled and a depression is formed in the second insulative layer over the filled via hole. The depression is tapered in a direction to the first conductive pattern. A portion of the second insulative layer below the depression is removed to form the via hole of the insulator.

BRIEF DESCRIPTION OF THE DRAWINGS

The present invention will be described in further detail with reference to the accompanying drawings, in which.

DETAILED DESCRIPTION

Figure 1A:
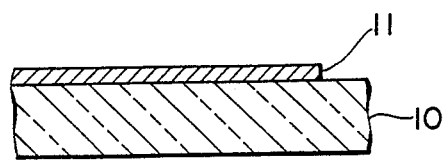
FIGS. 1a to 1h are cross-sectional views of a series of processes for preparing a portion of a multilayer printed circuit.
Figure 1B:
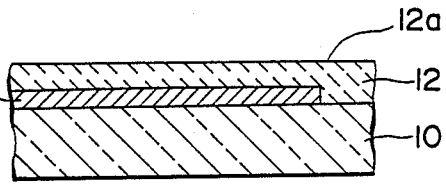
Figure 1C:
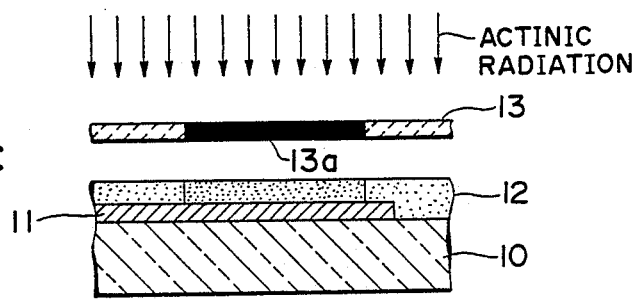
Figure 1D:
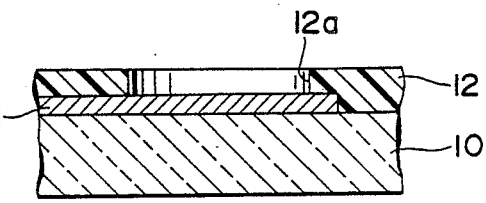
Figure 1E:
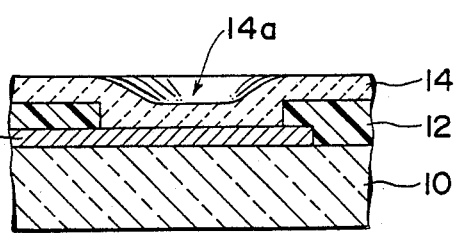
Figure 1F:
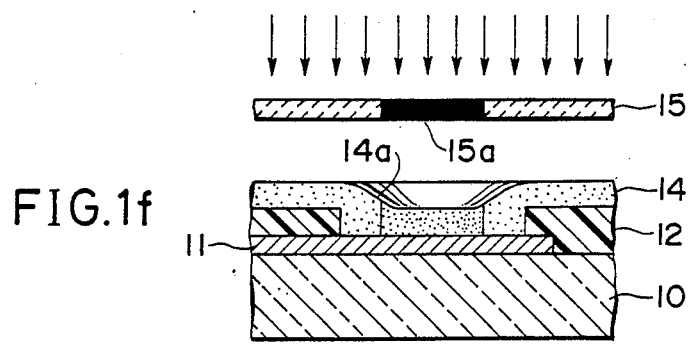
Figure 1G:
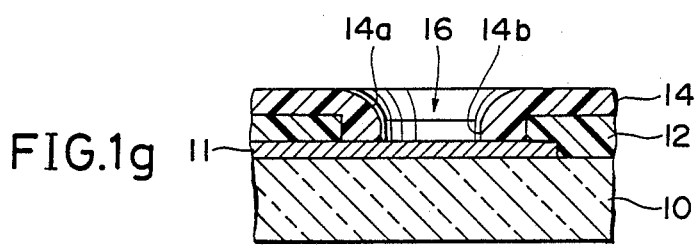
Figure 1H:
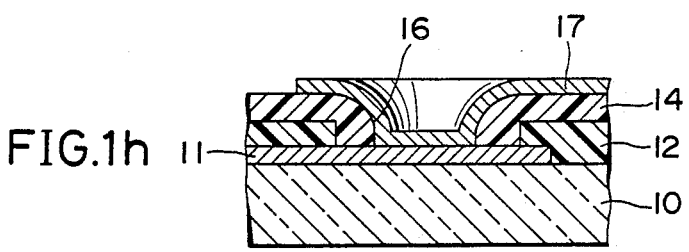

Referring to FIGS. 1a to 1h, there is shown a process of making a multilayer printed circuit according to the present invention. In FIG. 1a, a first conductive layer, or circuit pattern 11 is formed on a ceramic substrate 10 using a photolithographic process. A coat of polyimide 12 is deposited on the conductive layer 11 and substrate 10 so that it presents a flat surface 12a and then baked at 80° C. for 30 minutes (FIG. 1b). The polyimide layer 12 is then exposed to imagewise actinic radiation through a photomask 13 bearing a via image 13a and backed at 80° C. for 60 minutes (FIG. 1c) and then developed to form a via hole 12a in the polyimide layer 12 exposing a portion of the underlying conductive layer 11 as shown in FIG. 1d. The development process is followed by a curing process by which the polyimide layer 12 is heated at an elevated temperature of 400° C. for 15 minutes. As shown in FIG. 1e, a second coat of polyimide 14 is deposited on the first polyimide layer 12 and the exposed portion of the first conductive layer 11 so that it presents a depression 14a at the center of via hole 12a. The horizontal cross-sectional area of depression 14a decreases gradually as a function of distance from the upper surface of layer 14. A baking process is then performed to heat the second polyimide layer 14 at 80° C. for 30 minutes. A photomask 15 bearing a via image 15a is placed over the polyimide layer 14 to subject it to an imagewise actinic radiation (FIG. 1f) with the via image 15a being aligned with the center of depression 14a. It is important that the via image 15a have a smaller diameter than the via image 13a of the first photomask 13. The laminate is then baked at 80° for 60 minutes. A development process is then performed to remove a portion 14b of the polyimide layer 14, exposing a portion of the conductive layer 11. The development process is followed by a curing process for heating the laminate at 400° C. for 15 minutes (FIG. 1g). As shown in FIG. 1g, polyimide layer 14 has its inner edge covering the vertically extending side wall of via hole 12a. The depression 14a and the removed portion 14b of polyimide layer 14 form a via hole 16 having an upper portion thereof being advantageously downwardly tapered. A second conductive circuit pattern 17 is formed on via hole 16 and its surrounding areas according to a desired circuit pattern as illustrated in FIG. 1h. Because of the downwardly inclined side wall of via hole 16, the conductive circuit pattern 17 extends downward without discontinuities to the conductive layer 11 and establishes a reliable electrical contact with it. Specifically, due to the absence of stepped portions, there is no likelihood of the occurrence of discontinuities in the second circuit pattern 17 and of the leaving of photoresist materials at the corners of the stepped portions. In addition, the present invention does not require that the via image 15a be precisely aligned with the via hole 16 since its downwardly tapered portion allows a certain range of tolerances for the alignment.

Figure 2:
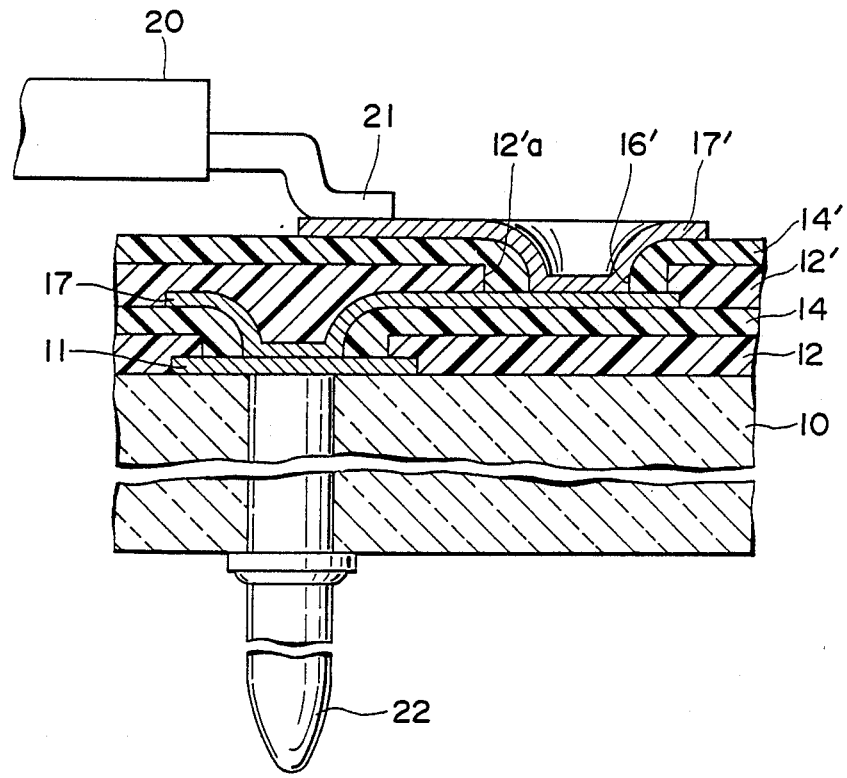
FIG. 2 is a cross-sectional view of a portion of multilayer printed circuit prepared according to the processes of FIGS. 1a through 1h.

The processes of FIGS. 1b to 1f are repeatedly performed to produce a multilayer printed circuit having conductive interconnections. As shown in FIG. 2, the second polyimide coat 14 is covered with a polyimide layer 12' corresponding to the layer 12 prepared according to the process of FIG. 1b and a via hole 12'a is formed therein according to the processes of FIGS. 1c and 1d. A further polyimide layer 14' with a via hole 16' is formed according to the processes of FIGS. 1f and 1g, and a circuit pattern 17' is formed on the lower circuit pattern 17 according to the process of FIG. 1h to establish conductive interconnections. A large-scale integrated circuit 20 may be coupled to the multilayer printed circuit by having multiple contacts 21 soldered to the circuit patterns 17'. Connector pins 22 extend through ceramic substrate 10 to the circuit patterns 11.

The foregoing description shows only one preferred embodiment of the present invention. Modifications are apparent to those skilled in the art without departing from the scope of the present invention which is only limited by the appended claims.

What is claimed is:

1. A process for preparing a printed circuit, comprising the steps of:
    (a) forming a first conductive circuit pattern on a substrate;
    (b) forming a first photosensitive insulative layer on said first conductive circuit pattern;
    (c) exposing said first photosensitive insulative layer to first imagewise actinic radiation and developing the exposed first layer to form a first via hole extending through said first photosensitive insulative layer to said first conductive circuit pattern, so that a portion of said first conductive circuit pattern is exposed to the outside through said first via hole;
    (d) curing said first photosensitive insulative layer;
    (e) forming a second photosensitive insulative layer of the same material as that of said first photosensitive insulative layer on said cured first photosensitive insulative layer and on said exposed portion of said first conductive circuit pattern so that the first via hole is partially filled to create a depression having a taper in a direction toward said first conductive circuit pattern;
    (f) exposing said second photosensitive insulative layer to second imagewise actinic radiation and developing the exposed second layer to form a second via hole extending from the bottom of said depression created by the step (e) to said first conductive circuit pattern, so that a portion of said first conductive circuit pattern is again exposed to the outside and said second via hole has a smaller diameter than the diameter of said first via hole formed by the step (c);
    (g) curing said second photosensitive insulative layer; and
    (h) forming a second conductive circuit pattern on said cured second photosensitive insulative layer and on the portion of said first conductive circuit pattern exposed again by the step (f) so that the second conductive circuit pattern covers the sidewalls of said depression and the sidewalls of said second via hole.

2. The process as set forth in claim 1, wherein said first and second photosensitive insulative layers are composed of polyimide.

* * * * *

UNITED STATES PATENT AND TRADEMARK OFFICE
CERTIFICATE OF CORRECTION

PATENT NO. : 4,980,270

DATED : December 25, 1990

INVENTOR(S) : Jun INASAKA

It is certified that error appears in the above-identified patent and that said Letters Patent is hereby corrected as shown below: Title page:

[54] PRINTED CIRCUIT AND A PROCESS FOR PREPARING SAME

Signed and Sealed this

Second Day of June, 1992

Attest:

DOUGLAS B. COMER

Attesting Officer

Acting Commissioner of Patents and Trademarks